US007134523B2

(12) United States Patent
Engebretson

(10) Patent No.: US 7,134,523 B2
(45) Date of Patent: Nov. 14, 2006

(54) SYSTEM FOR INTEGRATING MID-RANGE AND HIGH-FREQUENCY ACOUSTIC SOURCES IN MULTI-WAY LOUDSPEAKERS

(75) Inventor: Mark Engebretson, Encino, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 354 days.

(21) Appl. No.: 10/302,673

(22) Filed: Nov. 22, 2002

(65) Prior Publication Data

US 2003/0127280 A1 Jul. 10, 2003

Related U.S. Application Data

(63) Continuation of application No. 09/921,175, filed on Jul. 31, 2001, now abandoned.

(60) Provisional application No. 60/222,026, filed on Jul. 31, 2000.

(51) Int. Cl.

| | |
|---|---|
| ***H05K 5/04*** | (2006.01) |
| ***G10K 11/02*** | (2006.01) |
| ***G10K 11/04*** | (2006.01) |
| ***H04R 1/20*** | (2006.01) |
| ***H04R 1/24*** | (2006.01) |
| *A47B 81/06* | (2006.01) |
| *H05K 5/00* | (2006.01) |
| *H04R 1/02* | (2006.01) |

(52) U.S. Cl. ...................... 181/144; 181/147; 181/152; 181/184; 181/187; 381/335; 381/337; 381/339; 381/342; 381/387

(58) Field of Classification Search ................ 181/144, 181/146, 147, 152, 177, 184, 187, 191, 192, 181/148, 199; 381/303, 305, 73.1, 335, 337–340, 381/342, 387, 391

See application file for complete search history.

(56) References Cited

U.S. PATENT DOCUMENTS 2,766,839 A * 10/1956 Baruch et al. ............. 181/146

(Continued)

FOREIGN PATENT DOCUMENTS

DE 3621515 A1 1/1988

(Continued)

*Primary Examiner*—Edgardo San Martin

(57) ABSTRACT

This invention provides a radiation boundary integrator ("RBI") for integrating sound radiation from mid-range and high-frequency sources in multi-way loudspeakers. The RBI is a substantially solid boundary that is placed over the mid-range speakers to provide smooth, wave-guiding side walls to control the angular radiation of the high-frequency sound waves emanating from the high-frequency sound sources. To allow the mid-range frequency sound waves generated from mid-range sound sources to pass through the RBI, the RBI is designed with openings. To further prevent the possibility of having high-frequency sound radiate through the openings in the RBI, the RBI may be designed with porous material in the openings of the RBI. The porous material would be transparent to the mid-range sound radiation, but would prevent the high-frequency sound radiation from being disturbed by the openings in the RBI. As such, the RBI provides an outer or front surface area that forms an acoustical barrier to high frequencies radiating across the front surface, yet is acoustically transparent to mid-range frequencies radiating through openings in the RBI. The RBI may also serve as a volume displacement device to compression-load the mid-range sound sources by contouring the back side of the RBI to the shape of the mid-range sound sources thus reducing the space between the RBI and the mid-range sound sources and loading the mid-range sound sources to generate greater mid-range sound energy.

34 Claims, 6 Drawing Sheets

U.S. PATENT DOCUMENTS 3,938,618 A 2/1976 Ambruoso, Sr.
3,964,571 A * 6/1976 Snell .......................... 181/150
4,012,605 A * 3/1977 Jasinski ...................... 381/347
4,146,745 A * 3/1979 Froeschle et al. ............. 381/89
4,314,620 A * 2/1982 Gollehon .................... 181/144
4,381,831 A * 5/1983 Putnam ...................... 181/152
4,391,346 A * 7/1983 Murakami et al. .......... 181/147
4,437,540 A * 3/1984 Murakami et al. .......... 181/147
4,733,749 A * 3/1988 Newman et al. ............ 181/144
4,845,759 A 7/1989 Danley
4,893,695 A * 1/1990 Tamura et al. .............. 181/151
4,998,598 A * 3/1991 Mardian et al. ............ 181/284
5,115,883 A * 5/1992 Morikawa et al. .......... 181/152
5,233,136 A * 8/1993 Hamada ..................... 181/152
5,297,214 A * 3/1994 Bruney ....................... 381/431
5,324,896 A * 6/1994 Magnani ..................... 181/144
5,514,841 A * 5/1996 Rochon ...................... 181/156
5,526,456 A * 6/1996 Heinz ......................... 381/340
5,590,214 A * 12/1996 Nakamura .................. 381/182
5,710,394 A * 1/1998 Saito et al. ................. 181/152
6,038,326 A * 3/2000 Czerwinski ................. 381/340
6,112,847 A 9/2000 Lehman
6,118,883 A * 9/2000 Rocha ........................ 381/387
6,130,951 A * 10/2000 Nakamura et al. .......... 381/337
D450,778 S * 11/2001 Engebretson .............. D14/221
6,343,134 B1 * 1/2002 Czerwinski ................. 381/342
6,411,718 B1 * 6/2002 Danley et al. .............. 381/342
2002/0106097 A1 * 8/2002 Danley et al. .............. 381/345
2004/0003961 A1 * 1/2004 Gunness ..................... 181/189

FOREIGN PATENT DOCUMENTS

WO PCT/WO94/12002 11/1993

* cited by examiner

FIG. 4
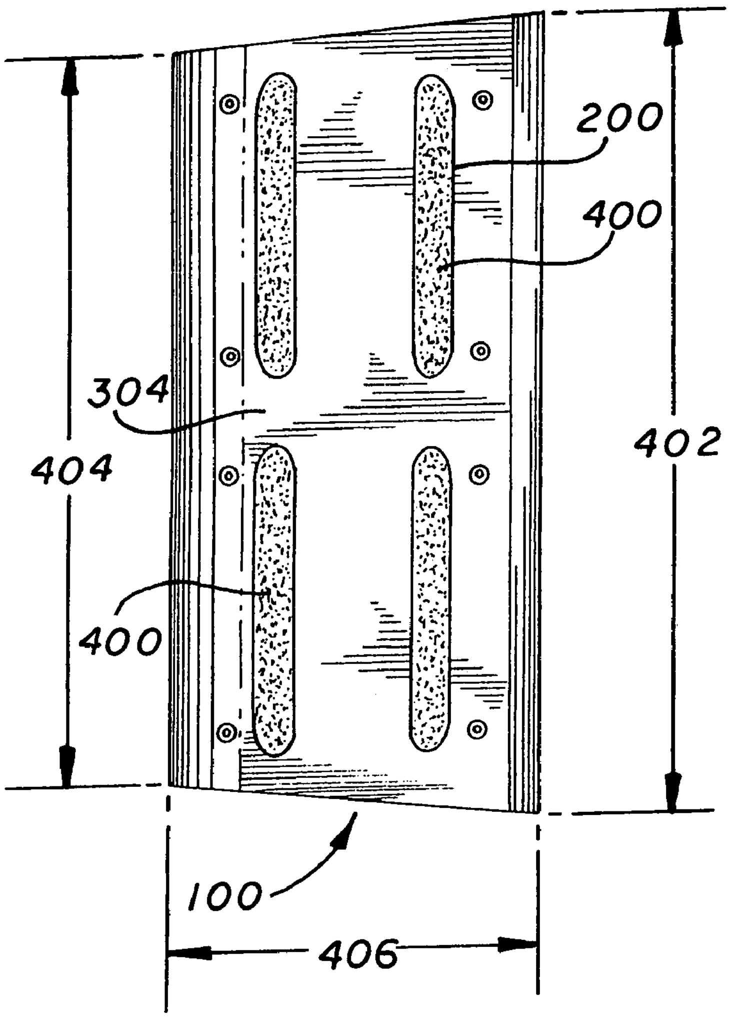
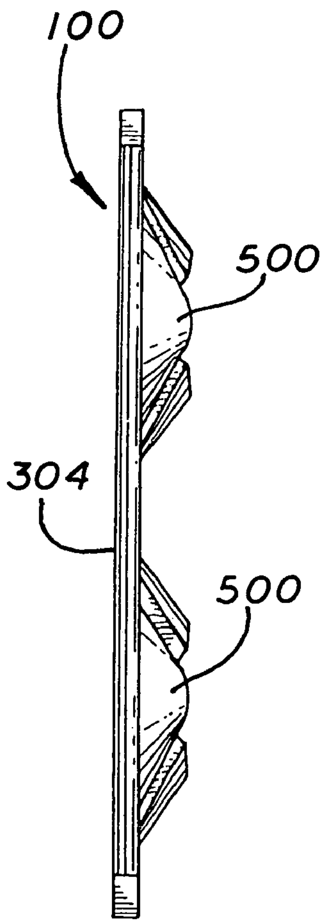
FIG. 5
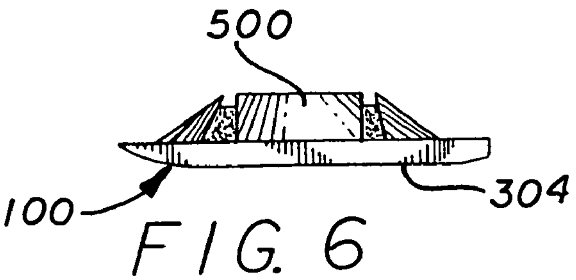
FIG. 6

SYSTEM FOR INTEGRATING MID-RANGE AND HIGH-FREQUENCY ACOUSTIC SOURCES IN MULTI-WAY LOUDSPEAKERS

CROSS-REFERENCE TO RELATED APPLICATIONS

This application is a continuation of U.S. patent application Ser. No. 09/921,175, filed Jul. 31, 2001, now abandoned which claims priority to U.S. Provisional Patent Application Ser. No. 60/222,026, filed Jul. 31, 2000. Both U.S. patent application Ser. No. 09/921,175 and No. 60/222,026 are incorporated by reference.

BACKGROUND OF THE INVENTION

1. Field of the Invention

This invention relates generally to a system for integrating the sound radiating from multi-way loudspeakers. In particular, the invention relates to a radiation boundary integrator positioned over a mid-range sound source to prevent angular radiation from high frequencies from conforming to the contours of the cones or diaphragms of the mid-range frequency sound source.

2. Related Art

Loudspeakers and sound systems are designed to control the direction of the sound radiating from their sound sources. Sound radiating from a high-frequency sound source, with the absence of sidewalls or boundaries, will generally radiate in all directions and possibly wrap around the sound source. This severely limits the predictability and control of the direction of the sound radiation. If, however, boundaries or sidewalls are placed adjacent to the sound source, the sound radiation will generally conform to the angle between the boundary surfaces. Thus, one of the advantages with using boundaries is the ability to control the direction that sound radiates from the sound source.

Another design objective of loudspeakers and sound systems is the ability to integrate a number of mid-range sound sources adjacent to a number of high-frequency sound sources into one housing. One common arrangement involves the positioning of several vertically stacked high-frequency sound sources having two adjacent side walls extending outward from the high-frequency sound sources, such that the high-frequency sound sources are at the vertex of the two adjacent side walls. The two adjacent sidewalls are positioned at an angle relative to one another and have mid-range sound sources positioned flush in the sidewalls. As such, the cones of the mid-range sound sources form part of the sidewalls extending outward from the high-frequency sound sources.

One of the problems with the design of certain loudspeaker systems is that the cones of the midrange sound sources form a recess or depression in the adjacent sidewalls. Because the adjacent sidewalls serve as high-frequency wave-guides, the recesses or depressions in the sidewalls prevent uniform angular radiation of the high-frequency sound waves that pass over these depressions. The angular radiation of high frequencies conforms to the contours of the cones or diaphragms of the mid-range frequency sound sources, compromising both the frequency-directivity and the quality of the high-frequency sound energy.

Another problem with the above design is the limitation on the size of multiple midrange sound sources that may be mounted into the two adjacent sidewalls. Larger diameter sound sources are usually desirable over smaller diameter sound sources because they can generate greater acoustic power. However, the upper frequencies generated by the larger midrange sources can 'lobe' or narrow in radiation angle if sources are large compared to the wavelength. This narrowing in radiation angle is due to the finite propagation velocity of sound. To avoid upper mid-frequency narrowing, a limit is placed on the size of the mid-range sound sources that can limit the acoustic output power of the mid-frequency range sound sources.

Therefore, a need exists to integrate radiation from the mid-frequency and high-frequency sound sources to better control the angular radiation of high-frequency sound waves. Furthermore, a need exists to improve the acoustic power or energy that may be produced by the mid-range sound sources.

SUMMARY

This invention provides a system for integrating sound radiation from mid-range and high-frequency sources in multi-way loudspeakers. This sound integration system provides improved control of the angular sound radiation of mid-range and high-frequency sound energy. The sound radiation system of this invention is formed of a substantially solid boundary that is placed over mid-range sound source speakers to provide a smooth, wave-guiding sidewall to control the angular radiation of the high-frequency sound waves emanating from the high-frequency sound sources. For purposes of illustration, this substantially solid boundary or sound integrator shall be referred to as a radiation boundary integrator ("RBI").

At least a portion of the RBI is substantially transparent to sound waves from the mid-range sound source. This may be accomplished by providing an opening in the RBI. Thus, the RBI is acoustically solid to high frequencies radiating across the outer surface, yet acoustically transparent to mid-range frequencies radiating through the openings in the surface.

Besides integrating the mid-range and high-frequency sound waves, the RBI may be used to compression load the mid-range frequency sound waves to improve the acoustic power output of the mid-range sound sources. Compression loading is accomplished by contouring the surface of the RBI that faces the mid-range sound sources, i.e., the back surface of the RBI, to the shape of the mid-range sound sources or speakers. Contouring the back surface reduces the space between the back surface of the RBI and the sound sources. The reduced space compression loads the mid-range frequency sound sources, enabling greater mid-range frequency sound output.

The RBI may be designed with porous material in the openings of the RBI. The porous material is designed with certain porosity to substantially minimize the possibility of having high-frequency sound radiate through the opening in the RBI, yet transparent to the midrange sound waves. With the porous material within the opening of the RBI, the high-frequency sound waves are substantially undisturbed by the openings in the RBI, and allow the mid-range sound waves to substantially pass through the opening.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood with reference to the following figures. The components in the figures are not necessarily to scale, emphasis instead being placed upon illustrating the principles of the invention. In the figures, like reference numerals designate corresponding parts throughout the different views.

FIG. 4 is a front view of a radiation boundary integrator having foam in the openings of the radiation boundary integrator.

FIG. 5 is a side view of the radiation boundary integrator illustrated in FIG. 4.

FIG. 6 is a bottom view of the radiation boundary integrator illustrated in FIG. 4.

DETAILED DESCRIPTION OF THE PREFERRED EMBODIMENTS

Figure 1:
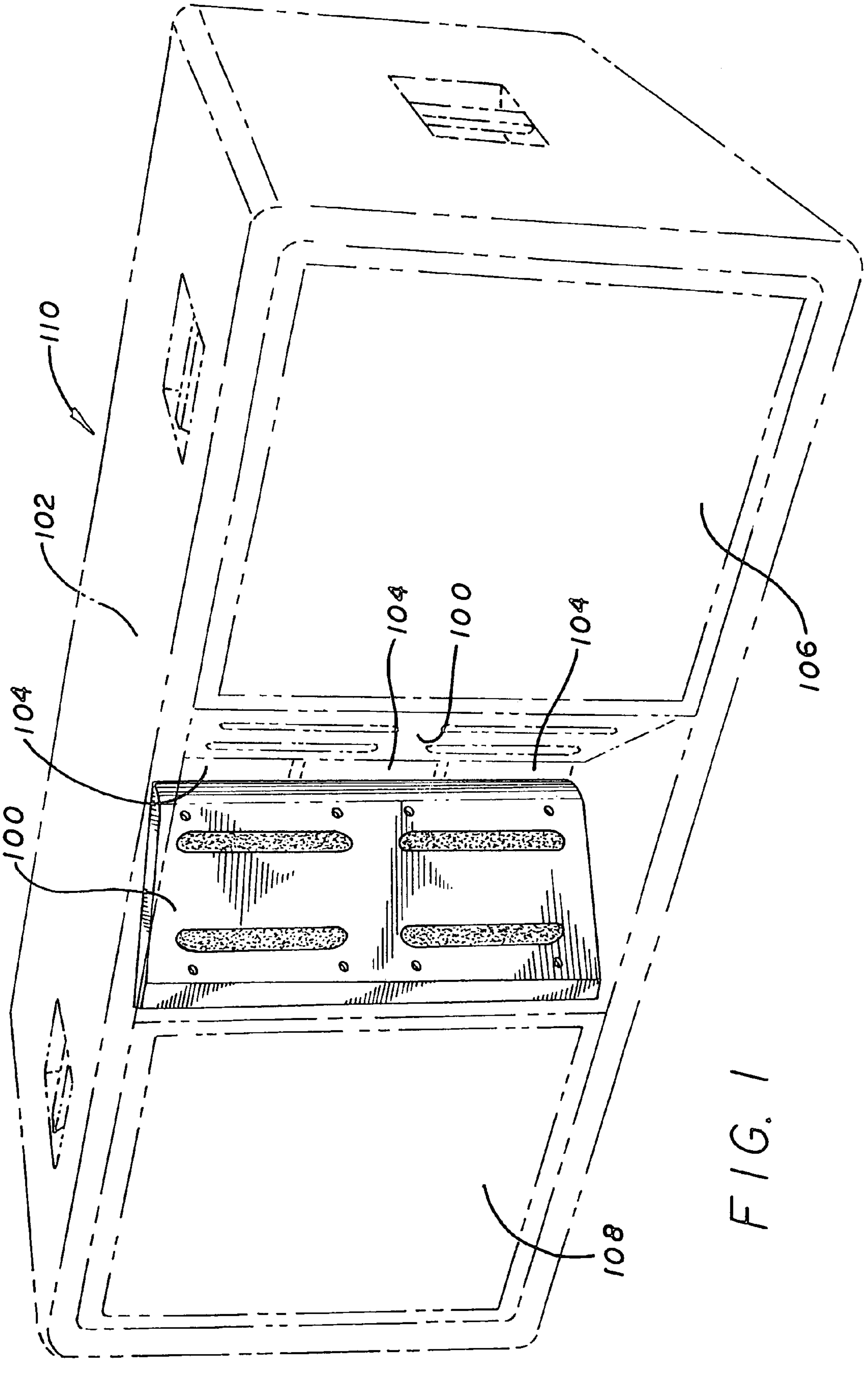
FIG. 1 is a perspective view of a multi-way loudspeaker having three vertically stacked high-frequency sound sources positioned at the vertex of two radiation boundary integrators.

FIG. 1 is a perspective view of a multi-way loudspeaker 110 use two sound integrators or radiation boundary integrators ("RBIs") 100. FIG. 1 illustrates the two RBIs 100 as they would appear positioned within a multi-way loudspeaker housing 102 ("housing"). In the exemplary line array speaker 110, a plurality of high-frequency sound sources 104 are stacked vertically in the mid-section of the housing 102. Two adjacent side walls (not shown) extend outwardly from the high-frequency sound sources 104 forming an angle relative to each other such that the high-frequency sound sources 104 are at the vertex of the two adjacent side walls. Flush within each of the side wall is at least one mid-range sound source (see FIG. 3). Each side wall is covered with the RBI 100 so that the high-frequency sound sources 104 are at the vertex of the two RBIs 100. Besides the high frequency 104 and mid-range frequency sound sources, the housing 102 may also incorporate low-frequency sound sources 106 and 108. The size and number of sound sources that are incorporated into a housing 102 may vary. In this example, the housing 102 may incorporate three (3) high-frequency sound sources 104, four (4) mid range sound sources (see FIG. 3) (two (2) mid-range sound sources positioned on each side wall), and two (2) low-frequency sound sources 106 and 108, totaling eleven (11) sound sources into line array speaker 110.

Figure 2:
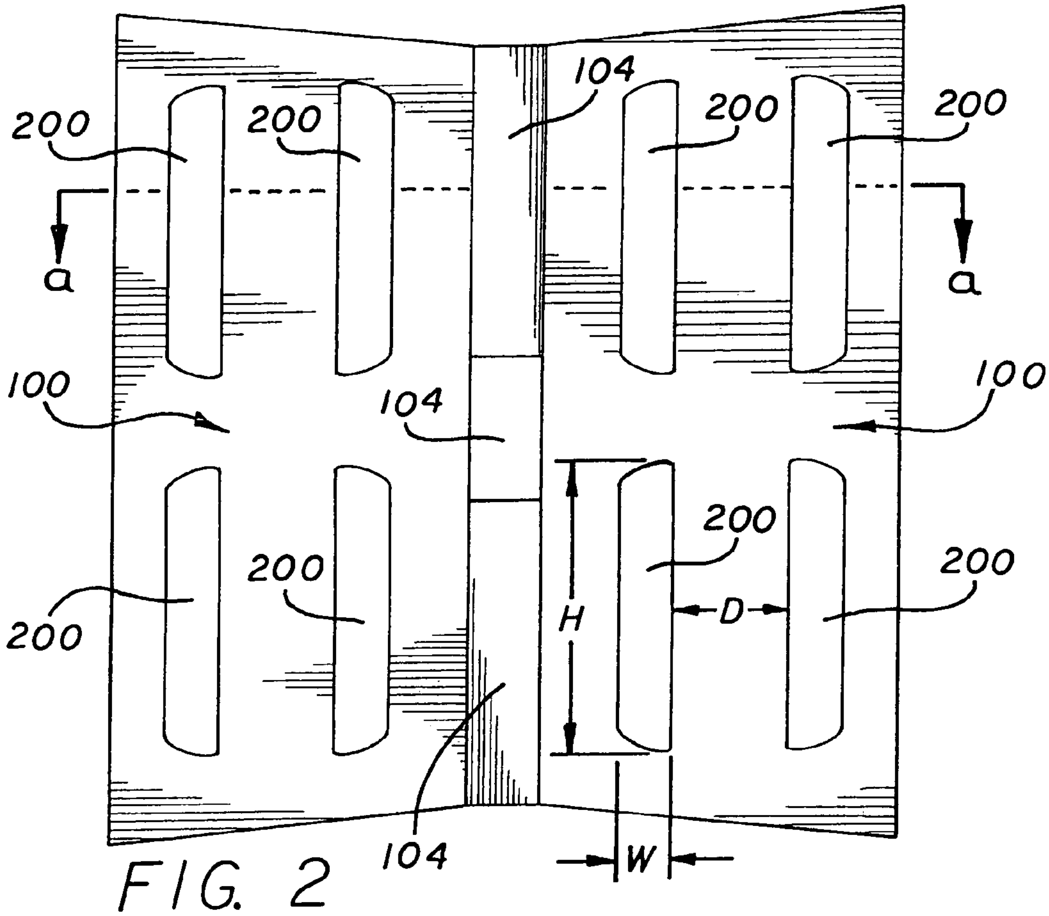
FIG. 2 is a front view of the two radiation boundary integrators of FIG. 1 as they may appear relative to various sound sources absent the housing.

FIG. 2 illustrates a front view of the two RBIs 100 of FIG. 1 as they would appear relative to various sound sources 104 absent the housing 102. One RBI 100 is positioned on each side of the three vertically stacked high-frequency sound sources 104, such that the three vertical high-frequency sound sources 104 are positioned at the vertex of the two RBIs 100. The RBIs 100 are positioned on each side of the high-frequency sound sources 104 and act as boundaries to control the direction of the sound waves from the high-frequency sources 104. The RBIs 100 have substantially flat and solid surfaces to control frequency-directivity and improve the quality of the high-frequency sound energy. Each RBI 100 is designed with at least one opening 200 to allow the mid-range frequency sound waves generated from mid-range sound sources (see FIG. 3) to pass through the RBIs 100.

Figure 3:
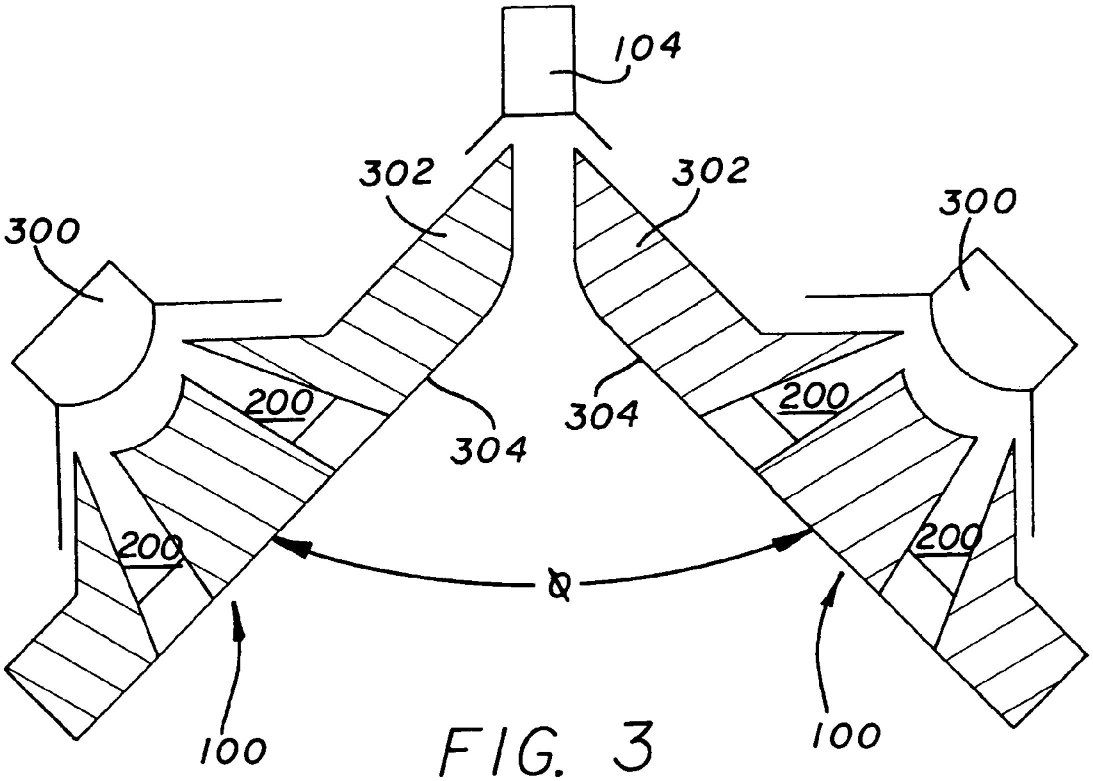
FIG. 3 is a cross-sectional top view of the two radiation boundary integrators taken along line a—a of FIG. 2.

FIG. 3 is a cross-sectional view of the two RBIs taken along line a—a of FIG. 2. FIG. 3 illustrates the positioning of the RBIs 100 relative to the high-frequency sound sources 104 and the mid-range sound sources 300. One RBI 100 is positioned on each side of the high-frequency sound sources 104 such that the high-frequency energy or sound waves from the high-frequency sound sources 104 propagate across the front surface 304 of the RBIs 100. The surfaces of the RBIs 100 are angled relative to one another, with the exception of a leading edge 302 that is angled inward, toward the high-frequency sound sources 104. The leading edges 302 are shaped to form a smooth transition between the high-frequency sound sources 104 and the substantially flat and solid front surface 304 of the RBIs 100. The two RBIs 100 are thus positioned adjacent to each other to function as a smooth wave-guide for the high-frequency sound waves generated by the high-frequency sound sources 104. As seen in FIG. 3, the two RBIs 100 are at a predetermined angle θ to control and direct the high-frequency sound waves emanating from the high frequency sound sources 104. The predetermined angle θ between the two RBIs 100 may vary from about 60° to about 100°, depending upon the application. In an auditorium setting, the predetermined angle is generally about 90°. Depending upon the application, the predetermined angle θ may be chosen by one of ordinarily skill in the art to optimize the performance of the speaker system.

FIGS. 2 and 3 illustrate the openings 200 in the RBIs 100 as four slots 200. Each slot 200 may be configured into an elongated rectangle and formed on each of the four quadrants of the RBI 100: (1) the upper right, (2) the upper left, (3) the bottom right, and (4) the bottom left. The width ("W") of each slot 200 may range from about ½ inch to about 1 inch. The distance ("D") between the two slots 200 may range from two to four times the width W or, D=K×W (where K ranges from two to four). Thus, if W is 1 inch, then D may be between about 2 inches and about 4 inches. In the example embodiment, the width is about 13/16 inch (≈2.0 cm) and the distance is about 2 9/16 inches (≈6.5 cm). The height ("H") of the slots 200 may be configured to be substantially equal to the diameter of the mid-range frequency sound source 300. Although the above example illustrates how the openings 200 may appear with three high-frequency 104 and four mid-range frequency sound sources 300, the size and shape of the openings 200 may be modified to accommodate any number of mid-range frequency or high-frequency sound sources 300 and 104, respectively.

FIG. 4 is a front view of the RBI 100 having a porous material 400 in each of the slots 200. In certain applications, the slots 200 may act as a cavity that interferes with the high-frequency sound waves passing along the front surface 304 of the RBIs 100. To minimize such an effect, the slots 200 in the RBIs 100 may be filled with the porous material 400, such as foam. The foam pieces 400 may be shaped to fit the openings 200, and may be inserted into the openings 200 to create a substantially solid acoustic surface 304 for the high-frequency energy generated by the high-frequency sound sources 104. As such, the porous material 400 substantially blocks the high-frequency sound waves that pass across the front surface 304 of the RBI 100 from passing through the slots 200. The porous material 400, however, is substantially transparent to the mid-range frequency sound waves to allow sound waves from the mid-range sound sources 300 to pass through the slots 200. Accordingly, the RBI 100 is substantially solid to high-frequency sound waves passing across the front surface 304 yet substantially transparent to mid-range sound waves passing through the slots 200. An example porous material 400 is foam having a porosity between about 60 porosity per square inch (PPI) and about 100 PPI. A foam section, having a porosity of about 80 PPI, may be optimal for appearing transparent to mid-range frequency. In addition to foam, any material that is substantially transparent to midrange frequencies, yet substantially blocks high frequencies may be used.

In addition to substantially blocking the high-frequency sound waves from passing through the slots 200, the foam 400 further serves as a low pass filter for the higher frequency sound waves generated by the mid-range sound sources 300. Without having foam 400 in the slots 200, the higher frequency sound waves from the mid-range sound sources 300 may pass through the slots and interfere with the high-frequency sound waves from the high-frequency sound sources 104. Thus, the foam in the slots 200 substantially prevents distortion of the higher frequency sound waves generated by the mid-range frequency sound sources 300.

FIG. 4 illustrates an example configuration of a RBI having a right side 402, a left side 404, and a base 406 sized to substantially mask or cover the mid-range frequency sound sources 300. In this example, the right side 402 may be greater in length than the left side 404 so that the space between the two RBIs 100 expands in the lateral direction and also in the vertical direction. In one example implementation, the right side 402 may range from about 16 inches to about 18 inches in length and the left side 404 may range from about 15 inches to about 16.5 inches in length. The base 406 may range from about 7 inches to about 9 inches in width.

FIG. 5 illustrates a side view of the RBI of FIG. 4. FIG. 5 illustrates how the RBI may further operate as a volume displacement device, in addition to providing a smooth flat front surface 304 for the high-frequency sound waves generated from the high-frequency sound sources 104. As shown in FIG. 5, the back side 500 of the RBI 100 may be formed to substantially contour the cone and/or the dome shape of the mid-frequency sound sources 300. To minimize the interference at the upper range of the middle frequencies, the back side 500 may be configured to be as closely adjacent as possible to the mid-frequency sound sources 300 without allowing the cone of the mid-frequency sound sources 300 to touch the back side 500 of the RBI when the cone vibrates. For example, the back side 500 may be separated from the mid-frequency sound sources 300 by about 0.2 inches to about 0.4 inches. The distance between the back side 500 and the mid-range frequency sound sources 300 may be about 0.375 inches.

By contouring the back side 500 of the RBI 100 to substantially match the cone and/or dome shape of the mid-frequency sound sources 300, the RBI effectively attenuates the higher frequencies, while improving the efficiency at the lower mid-range frequencies. The space in front of the mid-range sound source 300 may be substantially closed except for the openings 200 in the RBI 100. As such, the RBI 100 compression loads the mid-range frequency sound source 300 by making the cone surface of the mid-range sound sources 300 substantially oppose a solid surface leading to the slots 200 in the RBI, which allows for the transparency of the mid-range frequency sound waves. In other words, the acoustic load in front of the cones is greater with the RBI 100 masking the sound sources 300 than without the RBI 100. The diaphragm or cone surfaces of the mid-range sound sources 300 are then effectively transformed to a larger equivalent air mass, thus increasing the efficiency of the acoustic system at the lower frequencies.

In general, the mid-range frequency sound sources 300 are not designed to operate at frequencies where it may not be efficient. That is, as the effective size of the diaphragm becomes bigger, it is less efficient at higher frequencies than at lower frequencies because the total mass of the air load on the front of the diaphragm at higher frequencies is substantially greater. As such, the mid-range sound sources 300 using the RBI 100 may generate more midrange frequency to take advantage of the improved efficiency.

FIG. 6 is a bottom view of the RBI 100 illustrated in FIG. 4. Like FIG. 5, FIG. 6 illustrates the contouring of the back side 500 of the RBI 100 to compression load the mid-range frequency sound sources 300. Unlike FIG. 5, FIG. 6 illustrates the openings 200 in the RBI 100 extending through the contouring.

Figure 7:
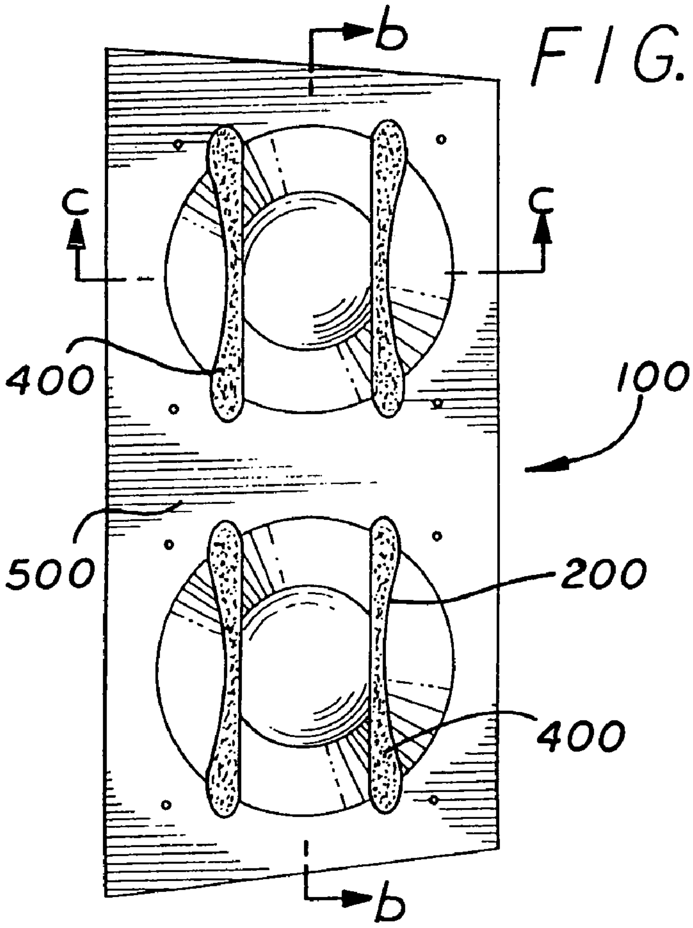
FIG. 7 is a rear view of the radiation boundary illustrated in FIG. 4.

FIG. 7 is a rear view of the RBI illustrated in FIG. 4. FIG. 7 illustrates the positioning of the openings 200 in the RBI 100 when the openings 200 are designed as slots 200 extending through the rear contouring of the RBI 100.

Figure 8:
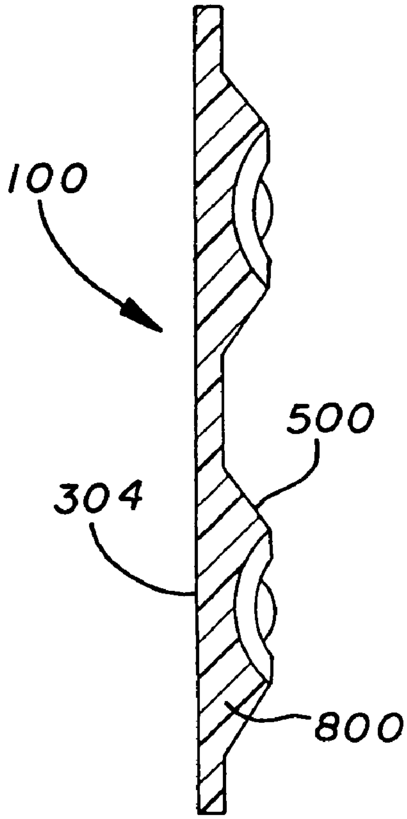
FIG. 8 is a cross-sectional view of the radiation boundary taken along line b—b of FIG. 7.

FIG. 8 is a cross-sectional view of the RBI taken along line b—b of FIG. 7. In particular, FIG. 8 illustrates the vertical mid-section of the RBI 100, having a substantially flat front surface 304 and contoured back side 500. While the RBI 100 may be solid or hollow, to be acoustically inert for damping purposes, the RBI 100 may be designed with solid exteriors, such as a vacuum foamed plastic, or like material. The interior of the RBI 100 may be filled with foam 800 or made of another porous material to keep the RBI 100 from being resonant and/or hollow sounding. Another advantage of using foam 800 in the interior is that it reduces the weight of the RBI 100. Although the exterior, or front surface and back sides 304 and 500 of the RBI 100 are described as being made of a vacuum foamed plastic, the exterior shell of the RBI 100 may be made of any variety of materials that provide an acoustical boundary to the high-frequency sound waves generated by the high-frequency sound sources 104.

Figure 9:
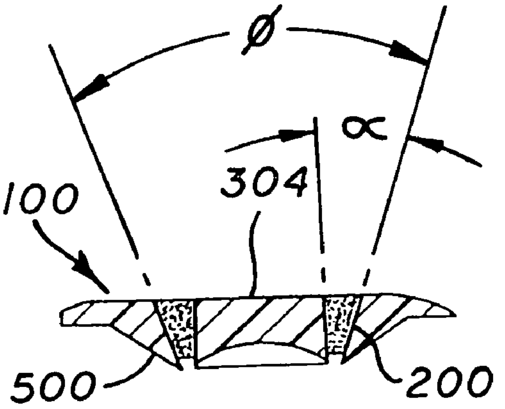
FIG. 9 is a cross-sectional view of the radiation boundary taken along line c—c of FIG. 7.

FIG. 9 is a cross-sectional view of the RBI 100 taken along line c—c of FIG. 7, and illustrates how the width of the slots 200 may gradually expand from the back side 500 to the front surface 304 of the RBI 100. For example, an acute angle $\phi$ may be formed between the two outer surfaces of two slots 200, and the slot 200 may expand at an acute angle $\alpha$. In this example, the acute angle $\phi$ may be between about 30° and about 50°, and in particular about 40°. The acute angle $\alpha$ may be about 15° to about 25°, and in particular about 20°. Alternatively, the slot 200 may expand in a curved line to provide a smooth transition or expansion from the back side 500 to the front surface 304.

Figure 10:
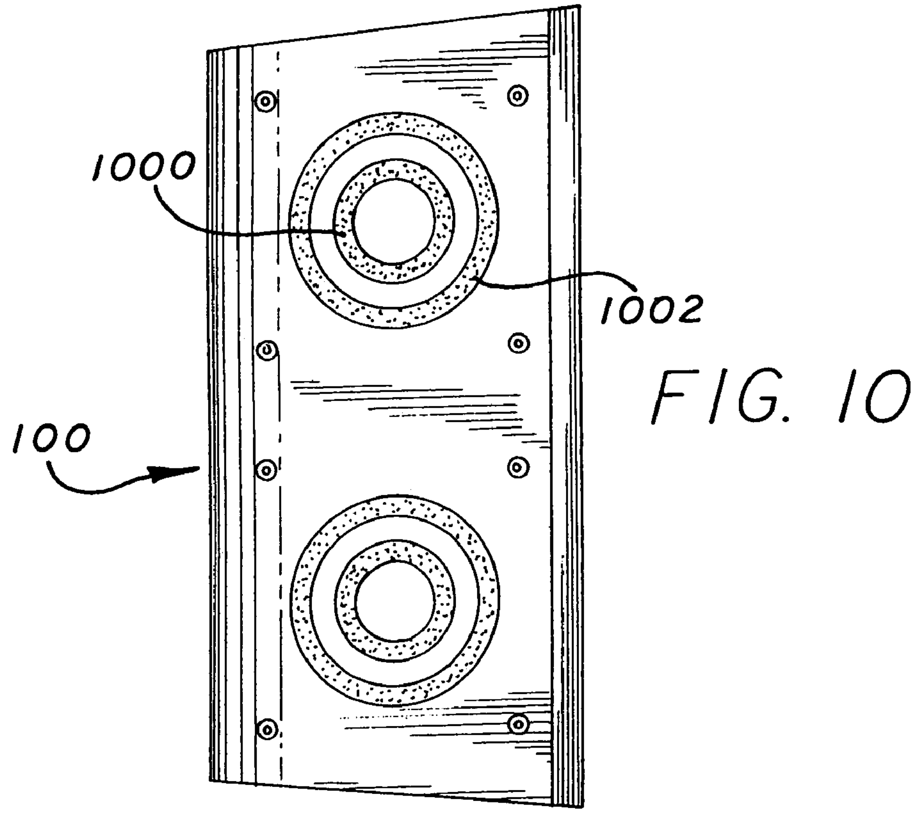
FIG. 10 is a front view of an alternative embodiment of a radiation boundary integrator.
Figure 11:
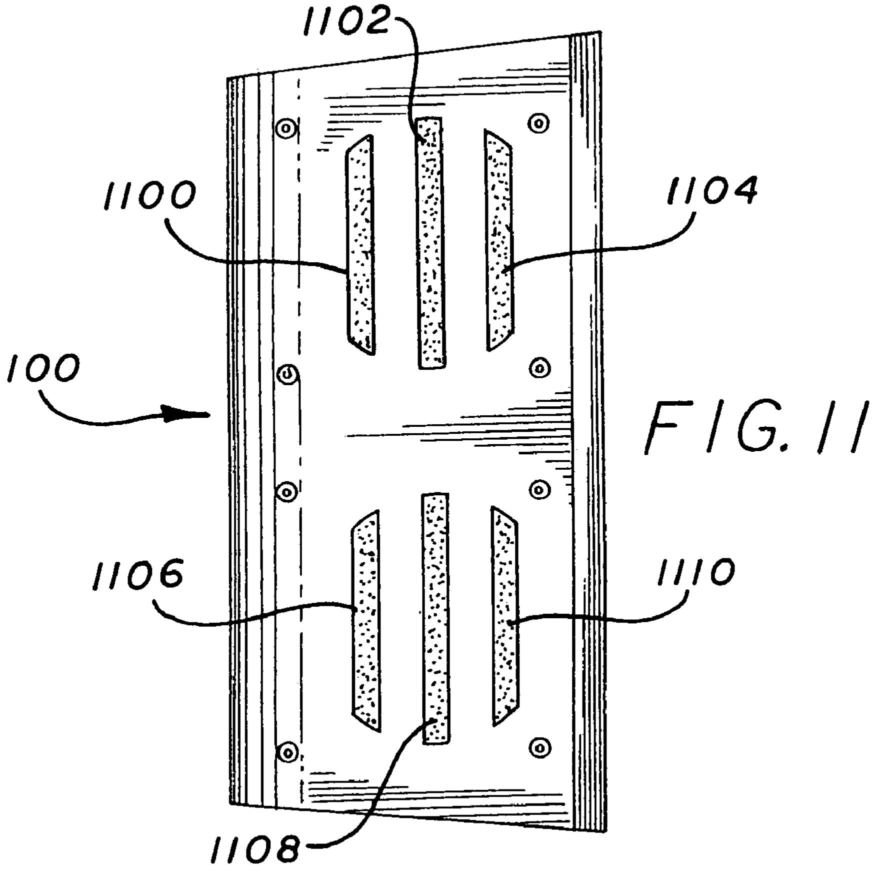
FIG. 11 is a front view of an alternative embodiment of a radiation boundary integrator.

FIGS. 10 and 11 illustrate alternative formations for the openings 200 that may be formed within the RBI 100. For example, the number of openings and their configurations may vary in size and shape to achieve the desired result of having the front surface 304 of the RBI 100 be substantially acoustically solid to high-frequency sound waves. FIG. 10 shows a smaller circular opening 1000 filled with foam 400 within a larger circular opening 1002 also filled with foam 400. FIG. 11 illustrates six slots 1100, 1102, 1104, 1106, 1108, and 1110 within the RBI 100, where each of the slots 1100, 1102, 1104, 1106, 1108, and 1110 has a smaller width than the slots 200, illustrated in FIG. 2. The RBI 100 may also be configured to have one continuous slot such as a slot forming an "O," "S" or "Z" shape, among other shapes.

In general, the size and configuration of the openings 200 may be modified to achieve the optimal sound. In certain applications, the foam inserts 400 may not be adequate to form a substantially solid acoustic surface for the high-frequency sound waves if the openings 200 are too large in size or number. Similarly, if the area of the openings 200 is too small, or if there are not enough openings 200, then the mid-frequency sound may not adequately pass through the openings 200.

Figure 12:
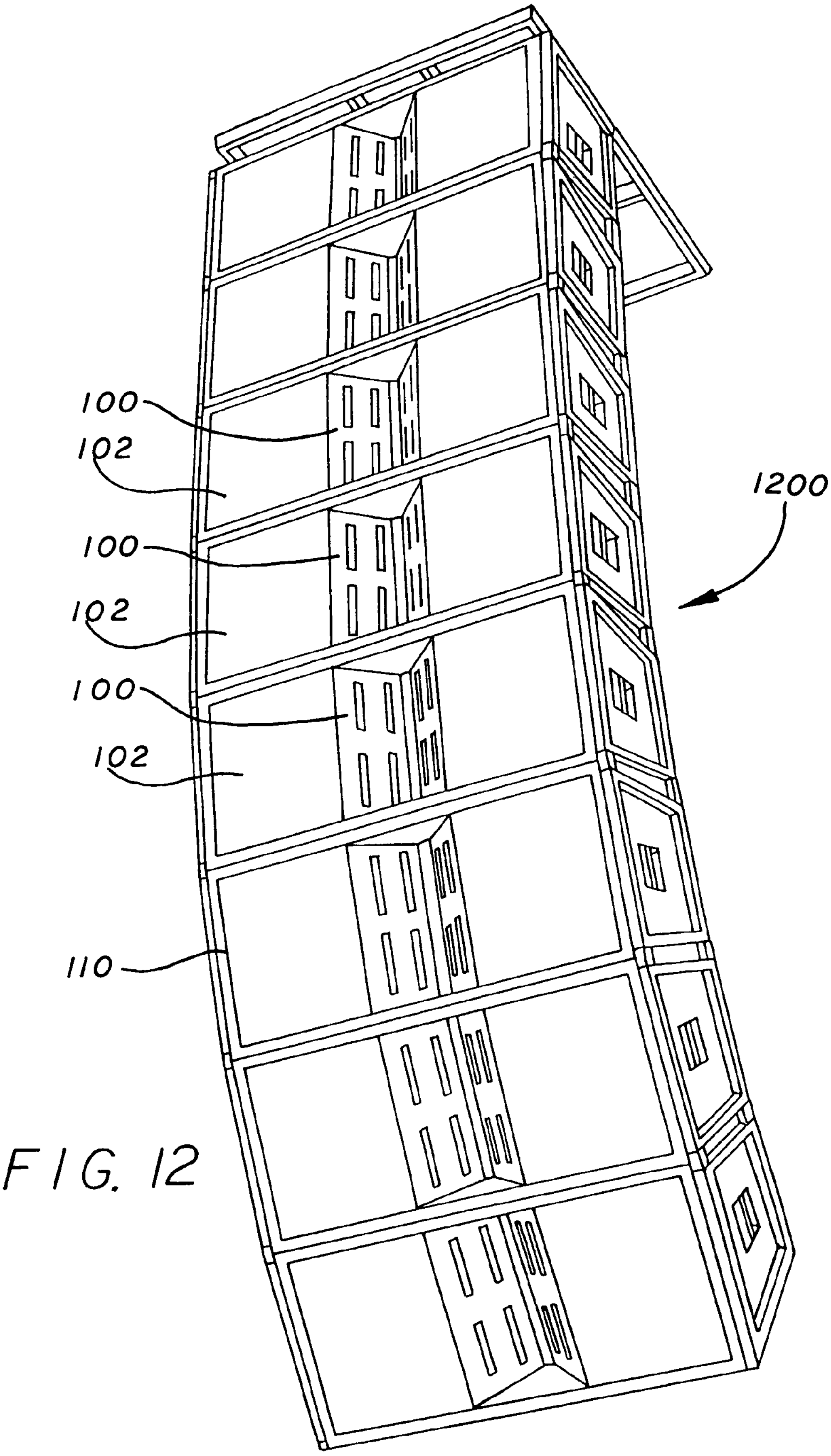
FIG. 12 is a perspective view of a series of the speakers illustrated in FIG. 1 stacked together to form a line array.

FIG. 12 is a perspective view of a series of multi-way loudspeakers 110 illustrated in FIG. 1 stacked together to form a line array 1200. Use of the RBIs 100 in the speakers 100 of a line array 1200 is particularly advantageous in that they are able to better direct sound radiation to a predetermined area. Accordingly, listeners seated within a predetermined area would receive substantially the same quality of sound as other listeners at other locations within the same area. This feature is particularly advantageous when used in large area performance environments, such as auditoriums.

Furthermore, line arrays typically are suspended from overhead, forming vertical lines of transducer arrays within their original bandwidths bass, mid-range, and treble. By forming those individual lines and curving these speaker arrays, improved dispersion uniformity and better control of the radiated sound may be realized. The sound radiating from the array of loudspeakers may be further improved by improved integration of the sound radiation from the mid-range and high-frequency elements by providing a RBI 100 for the high frequencies while allowing the mid-frequency sound to be emitted through the RBI 100 by way of openings 200 in the RBI 100 positioned in front of the mid-frequency speakers 300. This arrangement may also act as a volume displacement device to improve loading and efficiency of the mid-range frequency elements.

While various embodiments of the application have been described, it will be apparent to those of ordinary skill in the art that many more embodiments and implementations are possible within the scope of this invention. Accordingly, the invention is not to be restricted except in light of the attached claims and their equivalents.

What is claimed is:

1. A sound radiation boundary integrator, comprising:

a substantially flat front surface to control high-frequency sound waves;

a back side adapted to be juxtaposed to at least one mid-range frequency sound source;

at least one opening extending through the front surface and back side of the sound radiation boundary integrator, the at least one opening adapted to be juxtaposed to the at least one mid-range frequency sound source; and a porous material adapted to substantially fill the at least one opening, the porous material having a PPI that is substantially acoustically solid to high-frequency sound waves and substantially transparent to mid-range frequency sound waves.

2. The sound radiation boundary integrator of claim 1, where the back side is contoured to substantially conform to the at least one mid-range frequency sound source.

3. The sound radiation boundary integrator of claim 1, where the at least one opening is formed in the shape of a slot.

4. The sound radiation boundary integrator of claim 1, where PPI is between about 60 PPI and about 100 PPI.

5. A sound integrator comprised of a material that acts as a boundary for sound waves generate from a first sound source while passing sound waves generated from a second sound source, where the frequency of sound waves of the first sound source are higher than the frequency of the sound waves of the second sound source, where the sound integrator has at least one opening filled with a porous material, and the sound integrator is generally trapezoidal in shape and has at least four openings, one opening formed in each quadrant of the sound integrator.

6. The sound integrator of claim 5, where the sound integrator is made at least partially of a porous material.

7. The sound integrator of claim 6, where the porous material has a PPI that ranges from approximately 60 PPI to 100 PPI.

8. The sound integrator of claim 6, where the porous material is foam.

9. The sound integrator of claim 5, where the porous material has a porosity ranging between approximately 60 PPI and 100 PPI.

10. The sound integrator of claim 5, where the at least one opening is formed in the shape of a slot.

11. The sound integrator of claim 10, where the sound integrator has a front side and a back side, where the slot expands from the back side to the front side.

12. The sound integrator of claim 5, where the integrator has at least one opening for each second sound source.

13. The sound integrator of claim 5, where the sound integrator has a front surface and a back side, where the back side is contoured to substantially conform to the second sound source.

14. The sound integrator of claim 13, further including a dampening material between the front and back sides.

15. The sound integrator of claim 5, where the sound integrator has a front surface and a back side and where the front surface is substantially flat.

16. A multi-way speaker system having at least one high-frequency sound source and at least one mid-range frequency sound source, the multi-way speaker system comprising a boundary integrator positioned over the at least one mid-range frequency sound source, where the boundary integrator is adapted to be substantially transparent to sound waves from the at least one mid-range frequency sound source, but substantially solid to sound waves from the at least one high-frequency sound source, where the boundary integrator is made of a substantially solid material having at least one opening that is filled with a porous material, and the boundary integrator is generally trapezoidal in shape and has at least four openings, one openings formed in each quadrant of the sound integrator.

17. The system of claim 16, where the porous material is foam.

18. The system of claim 16, where the porous material has a porosity of approximately 60 PPI to 100 PPI.

19. The system of claim 16, where the boundary integrator has a front surface and a back side, where the back side is substantially contoured to the at least one mid-range frequency sound source.

20. The system of claim 19, where the sound integrator has a leading edge adapted to form a smooth transition for the sound waves from the at least one high-frequency sound source to the front surface of the sound integrator.

21. The system of claim 19, where the front side is substantially flat.

22. The system of claim 16, where the system includes adjacent side walls extending outwardly from the at least one high-frequency sound sources forming an angle relative to each other and where the system has a plurality of mid-range sound sources and at least one mid-range sound source is positioned flush within each of the side walls.

23. A multi-frequency speaker system having a first sound source and a second sound source that is of lower frequency than the first sound source, the multi-frequency speaker system comprising a sound integrator made of a material that acts as a boundary to the sound waves from the first sound source while being transparent to the sound waves of the second sound source, where the integrator has at least one opening that is filled with a porous material, and the sound integrator is generally trapezoidal in shape and has at least four openings, one opening formed in each quadrant of the sound integrator.

24. The system of claim 23, where the sound integrator is made at least partially of a porous material.

25. The system of claim 24, where the porous material has a PPI that ranges from approximately 60 PPI to 100 PPI.

26. The system of claim 24, where the porous material is foam.

27. The system of claim 23, where the at least one opening is formed in the shape of a slot.

28. The system of claim 23, where the integrator has at least one opening is position over the second sound source.

29. The system of claim 23, where the sound integrator has a front surface and a back side, where the back side is contoured to substantially conform to the shape of the second sound source.

30. The system of claim 23, where the sound integrator has a front surface and a back side and where the front surface is substantially flat.

31. A method for improving the sound quality of the multi-way loudspeaker having a mid-range sound source and a high-frequency sound source, the method comprising the steps of placing a boundary over the mid-range sound source that is substantially transparent to the mid-range frequency sound waves and that is acoustically solid to the high-frequency sound waves, contouring a back side of the boundary to substantially match the face of the mid-range sound source to compression load sound waves from the mid-range sound source, and compression-loading sound waves between the boundary and the mid-range sound source.

32. The method of claim 31, further including dampening the boundary to minimize resonance.

33. The method of claim 31, further including designing the boundary to have opening that allow the mid-range sound waves from the mid-range sound source to pass through the boundary.

34. The method of claim 31, further including filtering higher frequency sound waves generated by the mid-range sound source from interfering with sound waves from the high-frequency sound source.

* * * * *